(12) United States Patent
Tran et al.

(10) Patent No.: US 8,085,079 B2
(45) Date of Patent: Dec. 27, 2011

(54) SUMMING CIRCUIT FOR A FILTER

(75) Inventors: Kelvin Tran, Torrance, CA (US);
Matthias Bussmann, Los Angeles, CA (US); Lloyd Linder, Agoura Hills, CA (US); Salam Elahmadi, Dallas, TX (US); Harry Tan, Palos Verdes, CA (US)

(73) Assignee: Menara Networks, Dallas, TX (US)

( * ) Notice: Subject to any disclaimer, the term of this patent is extended or adjusted under 35 U.S.C. 154(b) by 0 days.

(21) Appl. No.: 12/832,844

(22) Filed: Jul. 8, 2010

(65) Prior Publication Data
US 2010/0271107 A1    Oct. 28, 2010

Related U.S. Application Data

(62) Division of application No. 12/119,394, filed on May 12, 2008, now Pat. No. 7,990,185.

(51) Int. Cl.
H03K 17/60    (2006.01)
H03M 1/66    (2006.01)

(52) U.S. Cl. .......... 327/361; 327/552; 327/561; 330/69; 330/252; 708/670

(58) Field of Classification Search .................. None
See application file for complete search history.

(56) References Cited

U.S. PATENT DOCUMENTS

| | | | |
|---|---|---|---|
| 4,146,844 A * | 3/1979 | Quinn | 330/149 |
| 5,012,245 A | 4/1991 | Scott et al. | |
| 5,362,992 A | 11/1994 | Wile | |
| 5,408,142 A | 4/1995 | Takatori et al. | |
| 5,563,819 A | 10/1996 | Nelson | |
| 5,587,689 A * | 12/1996 | Bowers | 330/254 |
| 5,734,276 A | 3/1998 | Abdi et al. | |
| 6,028,459 A | 2/2000 | Birdsall et al. | |
| 6,031,398 A | 2/2000 | Karanicolas | |
| 6,094,093 A | 7/2000 | Karanicolas | |
| 6,172,634 B1 | 1/2001 | Leonowich et al. | |
| 6,424,278 B1 | 7/2002 | Groeneweg | |
| 6,501,408 B2 | 12/2002 | Groeneweg | |
| 6,518,907 B2 | 2/2003 | Tsai | |
| 6,529,926 B1 | 3/2003 | Capofreddi | |
| 6,553,398 B2 | 4/2003 | Capofreddi | |
| 6,630,864 B2 * | 10/2003 | Yang | 330/254 |
| 6,795,001 B2 | 9/2004 | Roza | |
| 6,842,128 B2 | 1/2005 | Koh | |
| 6,844,838 B2 | 1/2005 | Mallinson | |
| 6,856,267 B1 | 2/2005 | Wang et al. | |
| 6,999,540 B2 | 2/2006 | Cranford, Jr. | |
| 7,026,970 B2 | 4/2006 | Wang et al. | |

(Continued)

OTHER PUBLICATIONS

United States Office Action dated Apr. 8, 2010 for U.S. Appl. No. 12/119,394, filed May 12, 2008 entitled Analog Finite Impulse Response Filter.

*Primary Examiner* — Lincoln Donovan
*Assistant Examiner* — Terry L Englund
(74) *Attorney, Agent, or Firm* — Blakely, Sokoloff, Taylor & Zafman LLP (57) ABSTRACT

According to one embodiment of the invention, a summing circuit comprises a first transmitter, a second transmitter, a first current offset circuit and a first transconductance amplifier. The first current offset circuit is coupled to the emitters of the first and second transistors. The first transconductance amplifier is coupled to the first current offset circuit.

11 Claims, 10 Drawing Sheets

U.S. PATENT DOCUMENTS

| | | |
|---|---|---|
| 7,042,377 B2 | 5/2006 | Oliaei |
| 7,167,517 B2 | 1/2007 | Farjad-Rad et al. |
| 7,188,135 B2 | 3/2007 | Takatori et al. |
| 7,346,645 B2 | 3/2008 | Reynolds |
| 7,528,754 B1 | 5/2009 | Bakkaloglu et al. |
| 7,639,309 B2 | 12/2009 | Zhong |
| 7,656,333 B2 | 2/2010 | Bruin |
| 2001/0043649 A1 | 11/2001 | Farjad-Rad |
| 2002/0062329 A1 | 5/2002 | Capofreddi |
| 2002/0140588 A1 | 10/2002 | Groeneweg |
| 2003/0025624 A1 | 2/2003 | Roza |
| 2004/0169596 A1 | 9/2004 | Koh |
| 2004/0233088 A1 | 11/2004 | Mallinson |
| 2005/0094722 A1 | 5/2005 | Takatori et al. |
| 2005/0179574 A1 | 8/2005 | Wang et al. |
| 2006/0097777 A1 | 5/2006 | Reynolds |
| 2007/0139563 A1 | 6/2007 | Zhong |
| 2008/0266156 A1 | 10/2008 | Bruin |

\* cited by examiner

SUMMING CIRCUIT FOR A FILTER

CROSS REFERENCE TO RELATED APPLICATIONS

This application is a divisional application and claims the benefit of priority on U.S. patent application Ser. No. 12/119,394, filed May 12, 2008, now U.S. Pat. No. 7,990,185.

FIELD

Embodiments of the invention generally relate to optical data links including wavelength division multiplexing (WDM) fiber optic transmitters, receivers and transceivers. Particularly, embodiments of the invention relate to an analog finite impulse response (FIR) filter operational at frequencies and data rates that support communications over a fiber optic cable or other dispersive media.

GENERAL BACKGROUND

In order to lower the cost of communications, it has become desirable to increase the data rate and the number of communication channels available. This is particularly true in fiber optic communication systems.

In fiber optic communication systems, wavelength division multiplexing (WDM) has been used over the same fiber optic communication link so that multiple channels of communication may be established over one fiber optic cable. The multiple channels of communication are established at different center wavelengths of light. However, the complexity of WDM and its higher data rates makes it expensive to use in low cost applications.

In the data link between fiber-optic transceivers, an emphasis has been placed on improving the electrical-to-optical (EO) and optical-to-electrical (OE) elements in order to provide for the increased data rates over the fiber optic cables. For example, the laser driver driving a semiconductor laser has been improved in order to maintain a wide data eye from transmitter to receiver and avoid data bit errors at high data rates. While these improvements have marginally increased the data rate, they have not alleviated the need for high capacity optical links with lower cost and simpler operation.

Additionally, the medium of the fiber optic cable used has been compensated for various optical signal impairments in order to accommodate higher data rates and reduce some types of distortion. However, current compensation techniques operating in the optical domain are bulky, expensive, and consume too much power. Moreover, these techniques only compensate for one type of distortion at a time, such as chromatic dispersion, and ignore other types of distortions. Furthermore, adding optical signal distortion compensators along an optical cable renders the network provisioning process more complicated and significantly increases the network operational expenses. Additionally, replacing existing lower data rate engineered fiber optic cables with compensated cables to lower distortion and to support higher data rates is very expensive.

The need for improved, cost-efficient distortion-mitigating techniques, such as an interleaved finite impulse response (FIR) filter supporting high signal sampling rates, is important to lower the cost of today's optical communications networks, enhance their performance, streamline and simplify their deployment and operation.

BRIEF DESCRIPTION OF THE DRAWINGS

Features and advantages of embodiments of the invention will become apparent from the following detailed description in which.

DETAILED DESCRIPTION

Embodiments of the invention set forth in the following detailed description generally relate to methods, apparatus, software, and systems for mitigating the distortions, both linear and nonlinear, that affect light pulses as they propagate over an optical fiber medium.

The embodiments of the invention are directed to a chip system that is designed to compensate a signal for orders of chromatic and polarization mode dispersive effects. The compensation from dispersive effects causes broadening of light pulses in an optical fiber, and combats nonlinear effects, in order to restore the shape of the optical pulses at a receiver. The chip system features an interleaved finite impulse response (FIR) filter that is used to allow for high signal sampling rates that are required for equalization in fiber optic transceiver. The FIR filter performs equalization for fine shaping of the incoming signal with inter-signal interference (IS) to replicate a targeted partial response $(1+D)^2$ waveform.

Figure 1A:
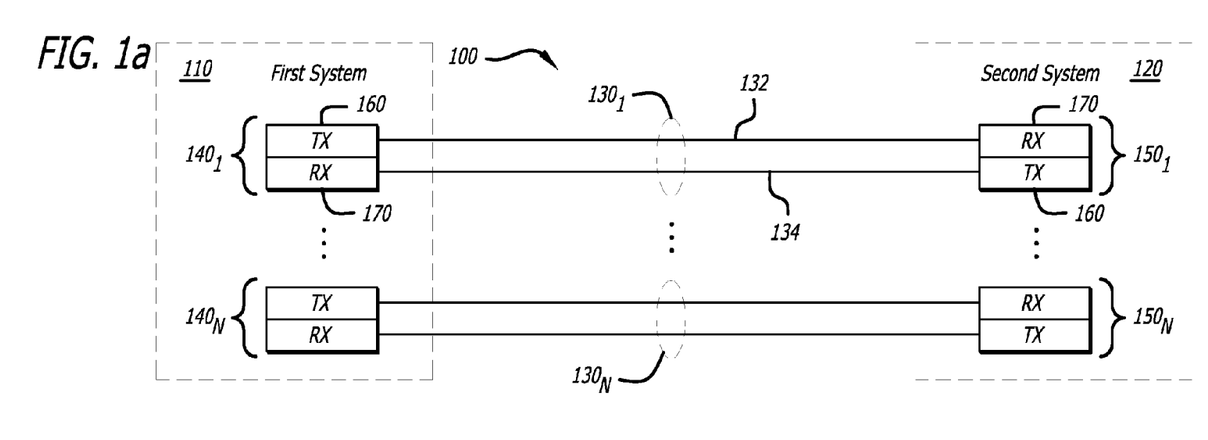
FIG. 1A is an exemplary block diagram of a fiber-optic communication system.

Referring now to FIG. 1A, a general embodiment of a fiber optic communication system 100 is shown. In the fiber optic communication system 100, a first system 110 is optically coupled to a second system 120 by means of optical communication channels $130_1$-$130_N$ (where N≧1). Each optical communication channel $130_1$-$130_N$ may be bi-directional, and if so, includes a first fiber optic communication link 132 and a second fiber optic communication link 134. If only unidirectional communications are desired, one of the first or second fiber optic communication links 132 or 134 can suffice for the communication channel depending upon the desired direction of the data transfer. Each fiber optic communication link 132 and 134 represents one or more fiber optic cables.

Wavelength division multiplexing (WDM) may be used over each of the fiber optic communication links to accommodate multiple channels of communications over a fiber optic cable. Bi-directional communication may also be provided over one fiber optic communication link 132 or 134 by using different wavelengths of light within the same fiber optic cable.

First system 110 comprises one or more fiber-optic transceiver modules 140₁-140ₙ. Similarly, second system 120 includes one or more fiber-optic transceiver modules 150₁-150ₙ. Each of the fiber-optic transceiver modules 140₁-140ₙ and 150₁-150ₙ include a transmitter (TX) 160 and/or receiver (RX) 170 in order to provided bi-directional communication. If unidirectional communication is desirable, a transmitter TX 160 may be placed within first system 110 while a receiver RX 170 would be placed at second system 120 instead of deployment of a transceiver at both systems 110 and 120.

Photons or light signals (e.g., data) are generated by transmitter TX 160 in the first system 110; transmitted through the fiber optic cable associated with link 132; and received by receiver RX 170 of the second system 120. On the other hand, transmitter TX 160 of the second system 120 can generate photons or light signals (e.g., data) and transmit them through the fiber optic cable of the link 134 which can then be received by the receiver RX 170 of first system 110. Thus, communication system 100 can utilize photons or light signals to bi-directionally communicate data through the fiber optic cables and the respective links between first system 110 and second system 120.

Figure 1B:
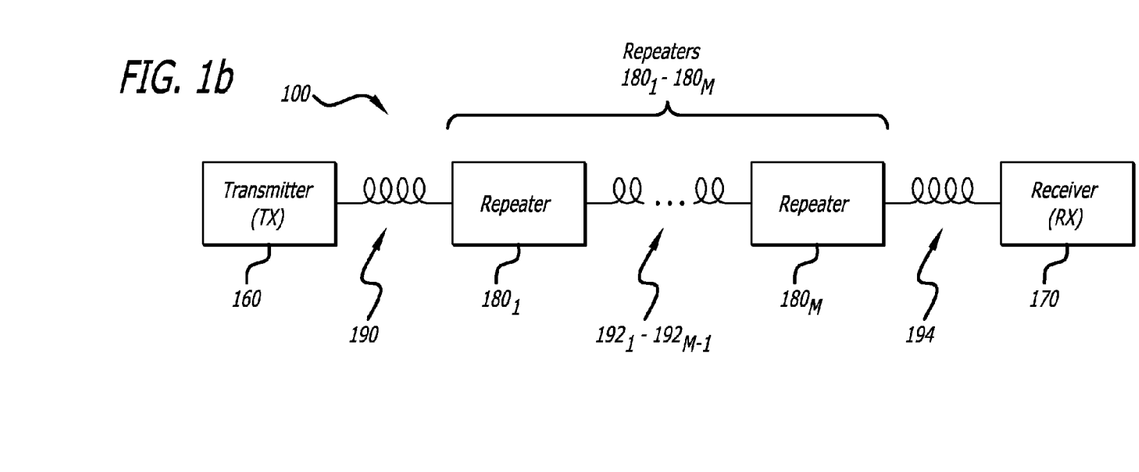
FIG. 1B is an exemplary block diagram of a more detailed version of the fiber-optic communication system.

Referring now to FIG. 1B, a more detailed embodiment of the fiber optic communication system 100 is shown. Herein, fiber optic communication system 100 is a long haul fiber optic communications channel with one or more repeaters 180₁-180ₘ (M≧1) between the ends of the communications channel. While such communications involve a unidirectional channel from a transmitter 160 to a targeted receiver 170, of course, it is contemplated that fiber optic communication system 100 can be readily expanded to support bi-directional communications.

From a first transmitter 160 to first repeater 180₁ is a first fiber optic cable 190. Between repeaters 180₁-180ₘ are fiber optic cables 192₁-192ₘ₋₁. Between the last repeater 180ₘ and the last receiver 170 is another fiber optic cable 194. The lengths of the fiber optic cable 190, fiber optic cables 192₁-192ₘ₋₁, and fiber optic cable 194 are typically as large as possible in order to reduce the number of repeaters 180₁-180ₘ.

Each repeater 180₁-180ₘ includes at least one receiver electrically coupled to a transmitter. In one embodiment, however, each repeater 180₁-180ₘ may include one or more transceivers.

Figure 2:
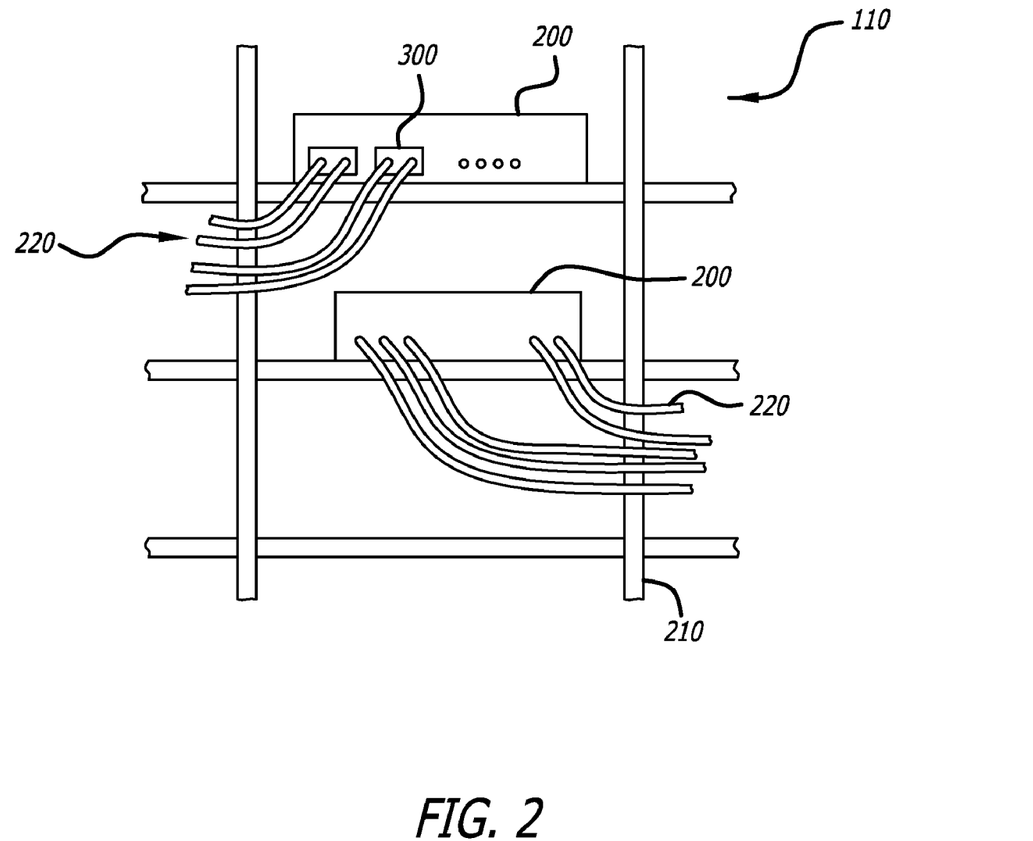
FIG. 2 illustrates a perspective embodiment of first system of the fiber-optic communication systems of FIGS. 1A-1B.

FIG. 2 illustrates a perspective embodiment of first system 110. As shown, first system 110 comprises a plurality of fiber-optic subsystems 200 (e.g., optical routers, bridges, or any optical transmitting and/or receiving components) that are positioned in close proximity to each other. For instance, as an illustrative example, a number of fiber-optic subsystems 200 may be positioned on a rack 210 and coupled to fiber optic cables 220 that interconnect first system 110 with other systems in different geographic areas. Each of the fiber-optic subsystems 200 comprises at least one fiber-optic module 300 operating as either (i) a transceiver (e.g., transceiver module 140₁), (ii) a transmitter, or (iii) a receiver.

Figure 3:
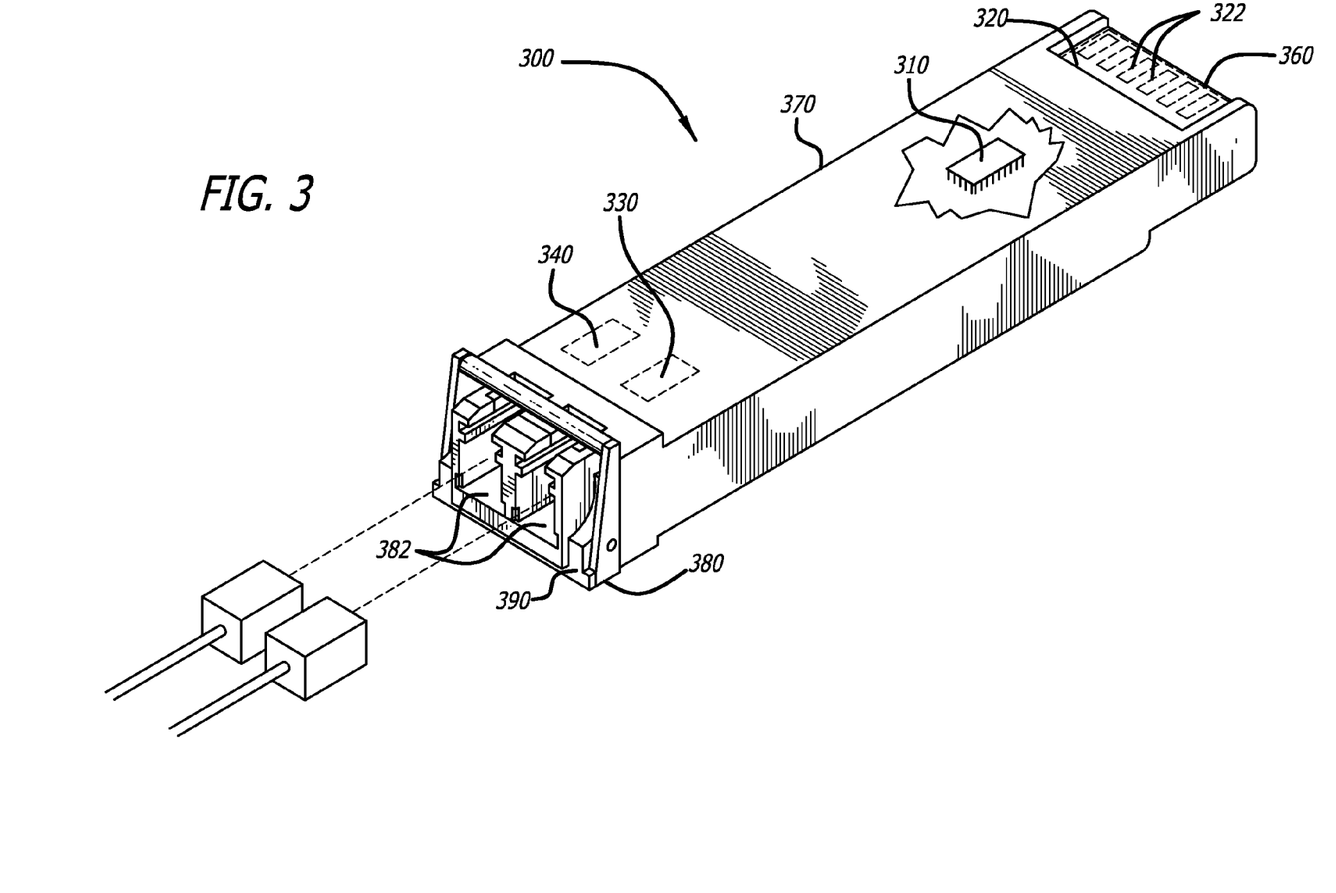
FIG. 3 is an exemplary block diagram of a fiber-optic transceiver module.

Referring now to FIG. 3, an exemplary of a fiber-optic module 300 is illustrated. As shown, fiber-optic module 300 includes an integrated circuit 310 mounted therein to a printed circuit board 320 that incorporates embodiments of the invention. As discussed previously, integrated circuit 310 may be one or more application specific integrated circuits (ASICs) to support the electronics of transmitter and/or receiver. Fiber-optic module 300 further includes a light transmitter 330 (e.g., an electrical-to-optical "EO" converter) and a light receiver 340 (e.g., an optical-to-electrical "OE" converter). Fiber-optic module 300 may be compatible with the 10 gigabit per second (10 GPS) small form-factor pluggable multisource agreement (XFP), the three hundred pin multi-source agreement (MSA), XPAK, X2, XENPAC and other proprietary or standard packages.

Printed circuit board 320 includes top and bottom pads (top pads 322 illustrated) to form an edge connector 360 to couple to a socket of a host printed circuit board (not shown). A housing 370 is positioned around printed circuit board 320 to protect and shield integrated circuit 310. A front fiber optic plug receptacle 380 is provided with openings 382 to interface with one or more fiber optic cables and their plugs. A mechanical latch/release mechanism 390 may be provided as part of the fiber-optic module 300. While fiber-optic module 300 has been described has having both light transmission and light reception capability, it may be a fiber optic transmitter module with light transmission only or a fiber optic receiver module with light reception only.

Figure 4:
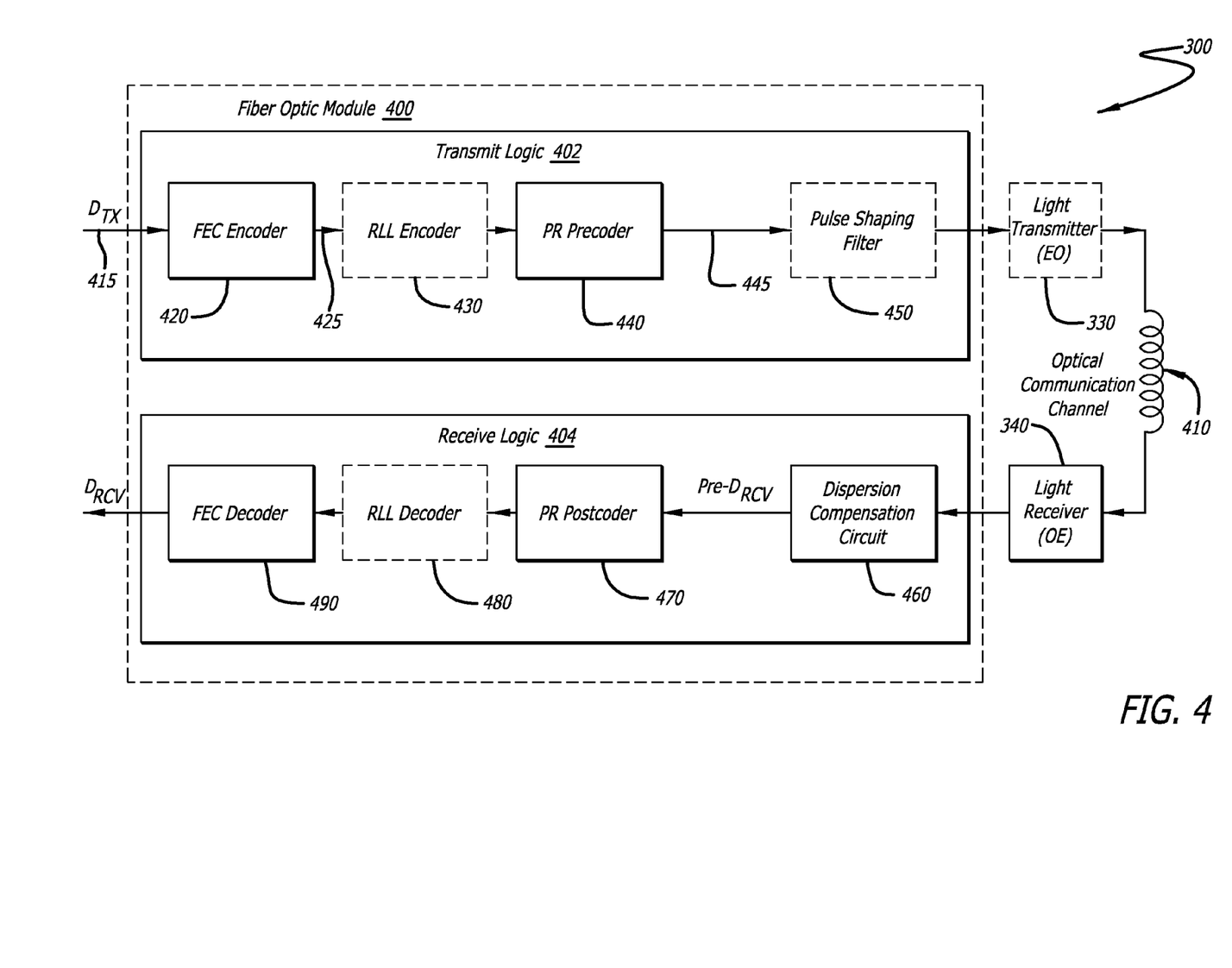
FIG. 4 illustrates an embodiment of a high level block diagram illustrative of electrical elements within the fiber-optic transceiver module of a fiber-optic subsystem of FIG. 2.

FIG. 4 illustrates an embodiment of a high level block diagram illustrative of electrical elements within fiber-optic transceiver module 300 of fiber-optic subsystem 200. Fiber-optic transceiver module 300 comprises a fiber-optic module 400 that is coupled to an optical communication channel 410. More specifically, fiber-optic module 400 comprises transmit logic 402 that is coupled to light transmitter 330 (e.g., an electrical-to-optical "EO" converter) and receive logic 404 that is coupled to a light receiver 340 (e.g., an optical-to-electrical "OE" converter). Both light transmitter 330 and light receiver 340 are coupled to optical communication channel 410.

More specifically, transmit logic 402 includes a fiber error correction (FEC) encoder 420, an optional run-length limited (RLL) encoder 430, a partial response (PR) precoder 440, and a pulse-shaping filter 450 adapted to perform spread pulse coding (SPC) or spread-pulse modulation (hereinafter generally referred to as a "spread-pulse modulator 450"). FEC encoder 420 is adapted to receive transmit data (Dtx) 415 and to create redundant data for error correction at the targeted receiver. Thereafter, encoded data 425 may be provided to an optional run-length limited (RLL) encoder 430. If implemented, RLL encoder 430 operates at a code rate chosen based on given constraints of optical communication channel 410.

In the event that RLL encoder 430 is not provided, the encoded data 425 is routed to PR precoder 440. PR precoder 440 performs pre-coding operations on encoded data 425 in order to produce pre-code data 445 that prevents catastrophic error propagation at a targeted receiver. Precoder 440 recursively correlates a sequence of bits of the stream of encoded data 425 so that there is a dependency between the data bits of the precoded data 445 at the transmitter. That is, the data bits in precoded data stream 445 are correlated to each other. When received at the targeted receiver, the precoding deters errors propagation during decoding.

In one embodiment of the invention, precoder 440 may implement the equation $y(n)=x(n) \oplus y(n-2)$ for example, where "y(n)" is the output of precoder 440 for sample number n, "x(n)" is the data input to precoder 440 for sample number n, "y(n−2)" is the output of precoder 440 for sample number (n−2), and the symbol "⊕" represents an exclusive-or (XOR) logical function. In another embodiment of the invention, precoder 440 may implement the equation $y(n)=x(n) \oplus y(n-1) \oplus y(n-2)$, for example. It is readily appreciated that other equations may be implemented to correlate bit sequences together at precoder 440, including using more orders as well as higher orders of correlation to correlate more bits and use an exclusive-nor logical function to perform the digital bit correlation in place of the exclusive-or logical function.

Precoded data 445 is output from precoder 440 to pulse-shaping filter 450. Pulse shaping filter 450 is designed to fit a suitable pulse response (e.g., Gaussian or raised cosine). Pulse-shaping filter 450 shapes the pulses of the precoded signal to spread out the pulses into a spread-pulse signal output that may be considered to perform spread pulse coding (SPC) or spread-pulse modulation (SPM). By spreading out the pulses in the spread-pulse signal, less distortion may be added by optical communication channel 410 (e.g., the channel response H(w)) during transmission. The pulse shape remains nearly unchanged during the transmission over optical communication channel 410. By spreading out the pulses in the time-domain, (reducing the spread of pulses in the frequency domain), the bandwidth of the original signal is reduced, the dispersion length ($L_D = T_0^2/B_2$, where "$B_2$" is the dispersion factor of channel, and "$T_0$" is the initial pulse width) is increased significantly, and the dispersion effects of the optical fiber are thus substantially eliminated.

Additionally, spread pulse coding (i.e., pulse spreading or spreading out pulses) is immune to non-linear distortions caused by the Kerr effect such as self-phase and cross-phase modulation and in PM-AM conversion. This immunity to nonlinear effects allows for higher launch power, and therefore higher SNR at the receiver, without any significant loss in performance. Additionally the pulse spreading allows for an exact matched filter design in the receiver that improves signal to noise ratios. Finally, due to its bandwidth-narrowing property, SPC (or SPM) allows for tighter WDM channel spacing.

For instance, according one embodiment of the invention, pulse-shaping filter 450 is an analog Bessel filter. In another embodiment of the invention, pulse-shaping filter 450 is an analog raised cosine filter. The parameters of the filters (e.g., order, bandwidth) are selected to minimize the bit-error rate at the receiver.

In implementation, pulse-shaping filter 450 may be implemented in the optical domain by using a dispersive element positioned after the electrical-to-optical (EO) element 330 in one embodiment of the invention. In another embodiment of the invention, pulse-shaping filter 450 is implemented in both the electrical domain and the optical domain. In another embodiment of the invention, the function of pulse-shaping filter 450 is integrated within the EO element 330. In yet another embodiment of the invention, pulse-shaping filter 450 may be unused and omitted.

According to this illustrative embodiment of the invention, the signal output from pulse-shaping filter 450, an electrical signal, is coupled into the electrical-to-optical (EO) converter 330. EO converter 330 is typically a semiconductor laser with a semiconductor laser driver (direct modulation) or external modulator. The spread pulse signal is used to modulate the laser output of the semiconductor laser (e.g., EO converter 330) in order to transmit data over the optical channel. Basically, EO converter 330 converts the spread-pulse signal from an electrical signal in the electrical domain into an optical or light signal in the optical domain.

Coupled to the optical fiber of optical communication channel 410, EO converter 330 transmits the spread-pulse signal over the optical fiber from transmit logic 402 to the targeted receiver. The optical or light signal of the transmitted spread-pulse signal experiences the channel response H(w) over the optical communication channel 410.

Similarly, receive logic 404 includes a dispersion compensation circuit 460 that is coupled to light receiver 340, a partial response (PR) postcoder 470, an optional run-length limited (RLL) decoder 480 and an FEC decoder 490. Dispersion compensation circuit 460 is described in FIG. 5 and is used to compensate for the dispersion effects caused by optical communication channel 410.

Figure 5:
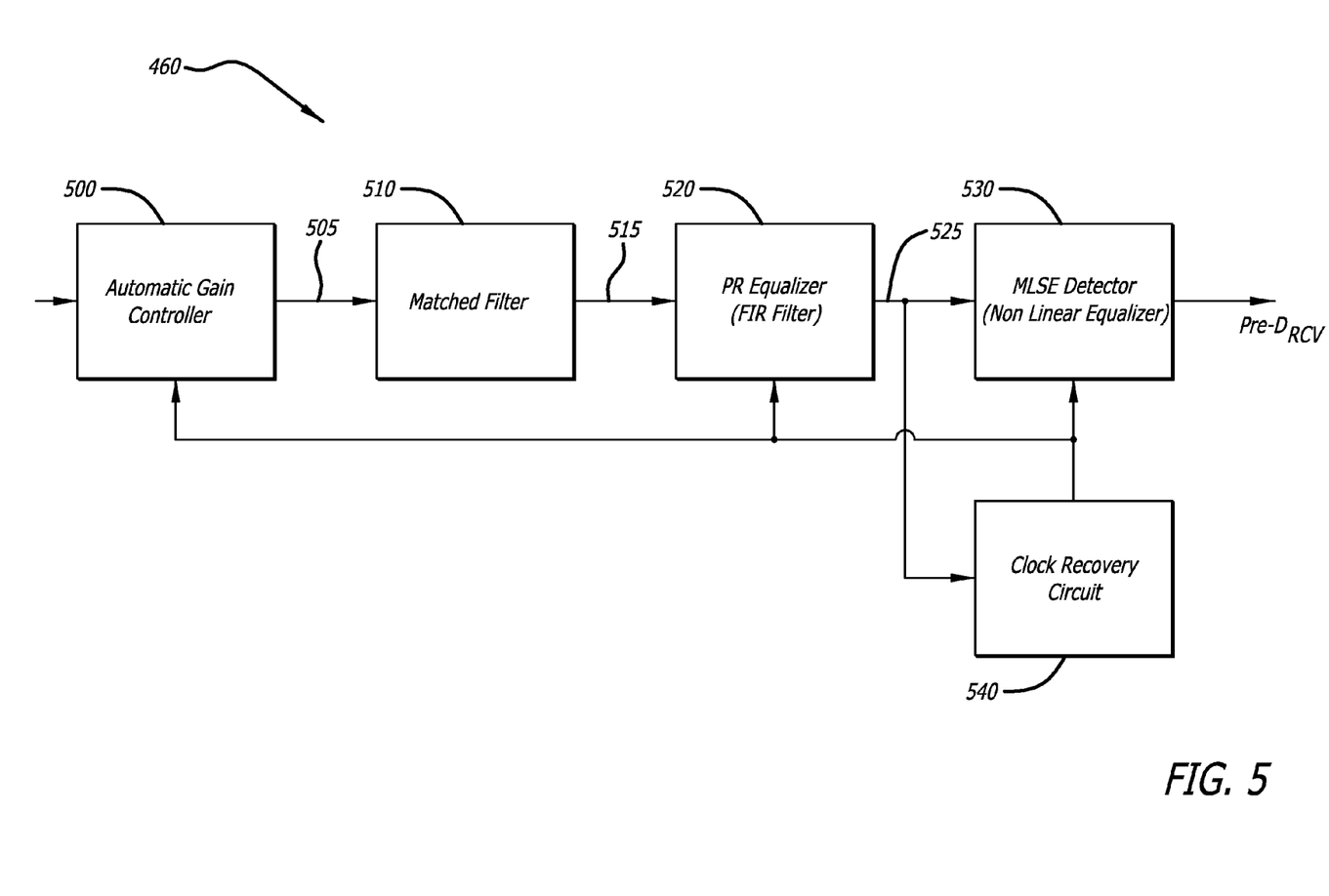
FIG. 5 illustrates an embodiment of a dispersion compensation circuit implemented within the fiber-optic transceiver module of FIGS. 3 and 4.

More specifically, according to one embodiment of the invention as shown in FIG. 5, dispersion compensation circuit 460 comprises an automatic gain control (AGC) 500, a continuous time filter 510 (referred to as a "matched filter"), a partial response (PR) equalizer 520, a maximum likelihood sequence estimation (MLSE) detector 530, and a clock recovery circuitry 540.

The AGC 500 provides gain for low amplitude signals and attenuation for high amplitude signals to limit or maintain the signal within a known range of amplitudes and keep the power level in the signal somewhat constant. This automatic gain control (AGC) enhances linearity in the system by reducing distortion and preventing saturation.

Gain-controlled signal 505 output from the AGC 500 is coupled into matched filter 510. Matched filter 510 may be implemented either as a digital filter or an analog filter. Matched filter 510 is designed to have a response that closely matches the combined transmitter/channel response H(w) so as to optimize the signal to noise ratio in the presence of noise. Matched filter 510 increases the signal-to-noise ratio of the receiver by filtering the received spread-pulse signal using a matched filter.

A matched filter typically has a response which maximizes the signal to noise ratio in the presence of white noise. To optimize the performance of dispersion compensation circuit 460, knowledge of the channel transfer function is helpful. The optical channel is treated as being weakly non-linear. The linear effects of the optical channel, such as dispersion and loss, dominate in the early part of a pulses journey down the optical channel. The channel non-linearities are included after the pulse disperses. The matched filter 510 is designed to fit a newly found transfer function that accurately describes the envelope of the fiber optic channel. In one embodiment of the invention, matched filter 510 is an analog filter that is matched to pulse-spreading filter 450. In which case, the transfer function used to describe the envelope of the fiber optic channel is a time domain linear solution given by equation of A(z,t) below where the square of the pulse width is much less than $B_2 z$.

$$A(z, t) \approx \frac{\tilde{A}\left(0, \frac{t}{B_2 z}\right)}{\sqrt{2\pi B_2 z}} \exp\left(-i \frac{t^2}{2 B_2 z}\right)$$

where $T_0^2$ is much less than $B_2 z$.

A(z,t) is the pulse response at a distance z away from the transmitter within the channel (e.g., the fiber) at a time t. $\tilde{A}(0,t/B_2 z)$ is the Fourier transform of A(0,t), the initial pulse at the transmitter (i.e., z=0) evaluated at the frequency f equal to $t/B_2 z$. Matched filter 510 solves the dispersion problem in the channel (e.g., the fiber) ignoring non-linear problems. Using this response equation, matched filter 510 can be simple, requiring no integration. Matched filter 510 is programmable based on channel properties such as distance z, dispersion factor of channel (e.g., the fiber) $B_2$, and initial pulse width $T_0$.

Figure 6:
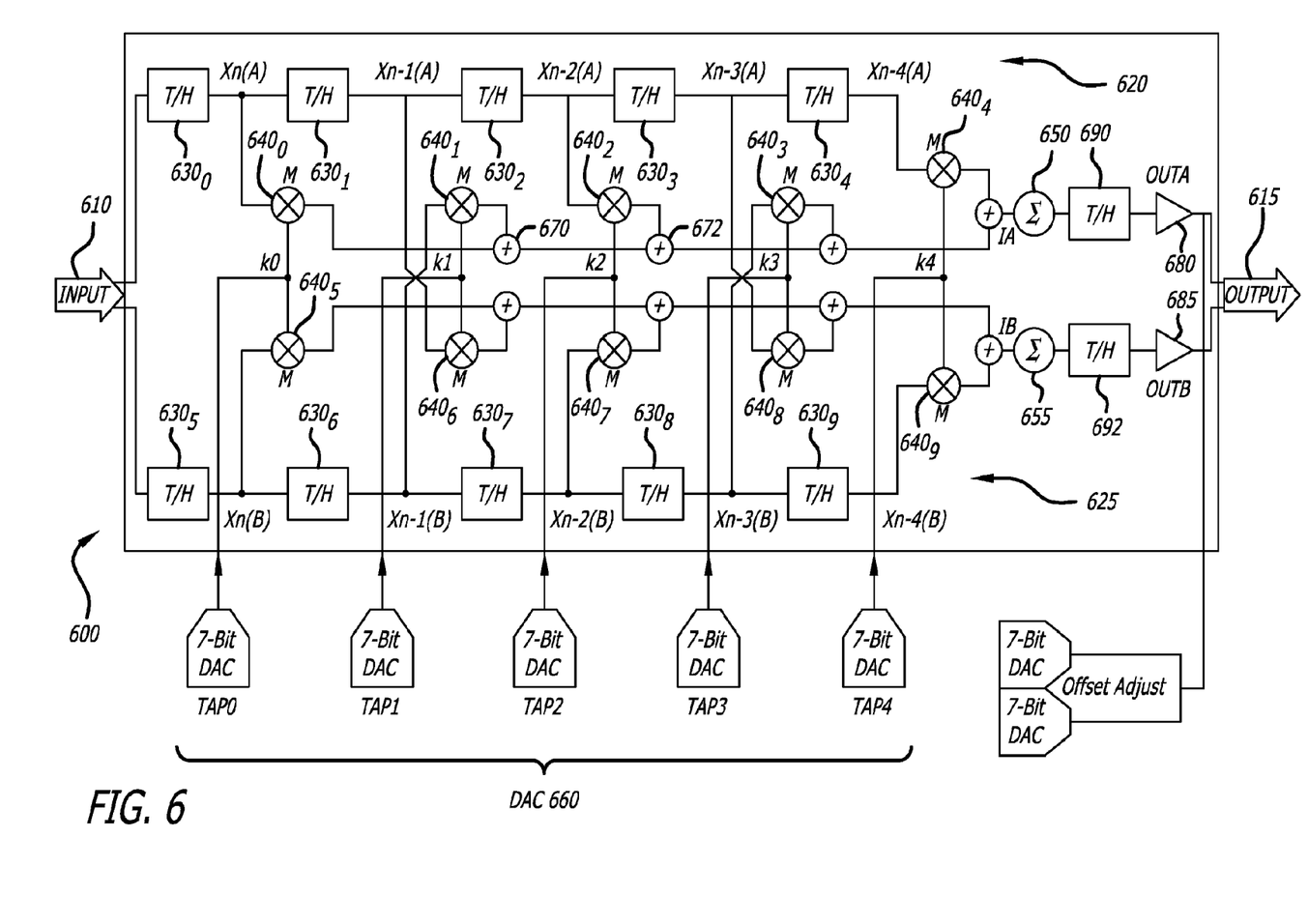
FIG. 6 illustrates an embodiment of an analog finite impulse response (FIR) filter implemented within the dispersion compensation circuit of FIG. 5.

The output of matched filter 510 is coupled into the input of a partial response (PR) equalizer 520. According to one embodiment of the invention, PR equalizer 520 is an adaptive filter that can be implemented as either an analog filter, a digital filter, or a combination thereof. In general, PR equalizer 520 shapes the spectrum of an incoming signal from the channel, a received spread-pulse signal 515 from matched filter 510, into that of a desired partial-response signal. That is PR equalizer 520 shapes received spread-pulse signal 515 into a desired target response 525, the partial-response signal, in order to reduce distortion by equalizing the linear distortion that may have been introduced by the channel. In one embodiment, PR equalizer 520 is an adaptive (programmable) finite impulse response (FIR) filter that can adapt to track variations in the channel response as shown in FIG. 6. PR equalizer 520 allows a controlled amount of intersymbol interference to be left in the equalized partial-response signal. This avoids zero-forcing equalization found in inverse channel equalization. PR equalizer 520 also does not suffer from noise enhancement and instability typically encountered in inverse channel equalization. Since, PR equalizer 520 is implemented as a FIR filter, it may be referred to as a linear equalizer.

The output of PR equalizer 520 is also coupled into an input of clock recovery circuitry 540. From the signal output of PR equalizer 520, clock recovery circuitry 540 generates or recovers a clock signal to synchronize data recovery functions together. The clock signal is coupled to PR equalizer 520, the maximum likelihood sequence estimation (MLSE) detector 530, such as a Viterbi detector and AGC 500. As a result, the timing of PR equalizer 520, MLSE detector 530, AGC 500, partial response (PR) postcoder 470, an optional RLL decoder 480 and FEC decoder 490 may be synchronized together.

Referring back to FIG. 4, PR postcoder 470 performs the inverse function of the PR precoder 440. As discussed previously, precoder 440 recursively correlates a sequence of bits of the stream of RLL encoded data to avoid error propagation at the receiver. That is, a sequence of data bits in the precoded data stream are correlated to each other before transmission. Thus, in the receiver, PR postcoder 470 recursively de-correlates a predetermined sequence of bits in the MLSE data signal (corresponding to correlated RLL coded data). The number of predetermined sequence of bits being de-correlated in the receiver may match the number of the predetermined sequence of bits that were correlated in the transmitter. This removes the dependency between data bits in the data stream.

As described above, PR equalizer 520 may be adapted as a programmable, interleaved FIR filter to track variations in the channel response. FIG. 6 illustrates an exemplary embodiment of FIR filter 600 operating as PR equalizer 520. Herein, FIR filter 600 comprises a plurality of track-and-hold (T/H) circuits, a plurality of multipliers, a plurality of summing circuits, a tap weight programming circuit and an offset adjustment circuit.

For this illustrative embodiment shown in FIG. 6, FIR filter 600 is a five-tap FIR filter that includes a pair of banks 620 and 625 that receive an analog signal 610 as input data and are interleaved to produce an output 615. A first bank 620 (phase A) is clocked by a half-rate recovered sampling clock (CLK A) and includes five (5) T/H circuits $630_0$-$630_4$, five multipliers $640_0$-$640_4$ and a first summing circuit 650. A second interleaved bank 625 (phase B) is clocked by a half-rate recovered sampling clock (CLK B), which is 180° out-of-phase with CLK A, and includes five (5) T/H circuits $630_5$-$630_9$, five multipliers $640_5$-$640_9$ and a second summing circuit 655. Hence, FIR filter 600 is adapted to sample two data points of analog signal 610 during a single clock period.

For instance, FIR filter 600 may be an 11.3 gigabit/second (Gb/s) analog finite impulse filter operating from a single supply 3.3V in 0.18 µm SiGe BiCMOS technology. The interleaved configuration enables the clocking of banks 620 and 625 to be around 5.6 gigahertz (GHz) while achieving greater throughput. This five-tap filter delivers superior accuracy (SDR=50 db) and ultra wideband input bandwidth. A power-down and offset compensation feature has also been incorporated into FIR filter 600.

More specifically, first bank 620 comprises a first T/H circuits $630_0$ that samples analog signal 610 at CLK A and outputs sampled data Xn(A) to T/H circuit $630_1$ and multiplier $640_0$. Tap weight programming circuit 660 (e.g., digital-to-analog converter "DAC") is coupled to multipliers $640_0$-$640_9$ in order to adjust tap weights (coefficients k0-k4) that are multiplier products of outputs from T/H circuits $630_0$-$630_9$.

As an example, sampled data Xn(A) is multiplied by k0 to produce a result k0*Xn(A) that is provided to an adder circuit 670 for combination with an interleaved sampled data from bank 625 that has been delayed one clock cycle (e.g., k1*Xn−1(B)). This summed result is combined with sampled data Xn−2(A) (sampled data delayed by two clock cycles) is multiplied by k2 to produce a result k2*Xn−2(A) that is provided to an adder circuit 672 for combination with an interleaved sampled data from bank 625 that has been delayed three clock cycles (e.g., k3*Xn−3(B)). This result is summed with sampled data Xn−4(A) (sampled data delayed by four clock cycles) is multiplied by k4 to produce input IA. The computation for input IB is performed in a similar fashion.

As a result, in general, the output at time n, referred to as "Y(n)," would be the following:

$Y(n) = \sum_{i=0-4} k_i(n) \times (n-i)$, where $k_i(n)$ represents the respective tap weights, and
x(n−i) represents the delayed samples.

Therefore, the inputs (IA, IB) into summing circuits 650 and 655 are set forth in equations (1, 2) below:

$$IA = k0*Xn(A) + k1*Xn-1(B) + k2*Xn-2(A) + k3*Xn-3(B) + k4*Xn-4(A) \quad (1)$$

$$IB = k0*Xn(B) + k1*Xn-1(A) + k2*Xn-2(B) + k3*Xn-3(A) + k4*Xn-4(B) \quad (2)$$

Summing circuits 650 and 655 are coupled to outputs 680 and 685, respectively. More specifically, the summing circuits 650 and 655 are coupled to corresponding T/H circuits 690 and 692 that operate as delays prior to placement on output to allow offset current controlled by digital-to-analog converter (DAC) 660 to be used to substantially eliminate any offset in the differential output voltage. For instance, each bit of DAC 660 supports a voltage swing of approximately 1.4 millivolts (mV) so that the seven-bit DAC can offset a differential voltage output that swings up to and perhaps surpassing 140 mV as needed.

Figure 7:
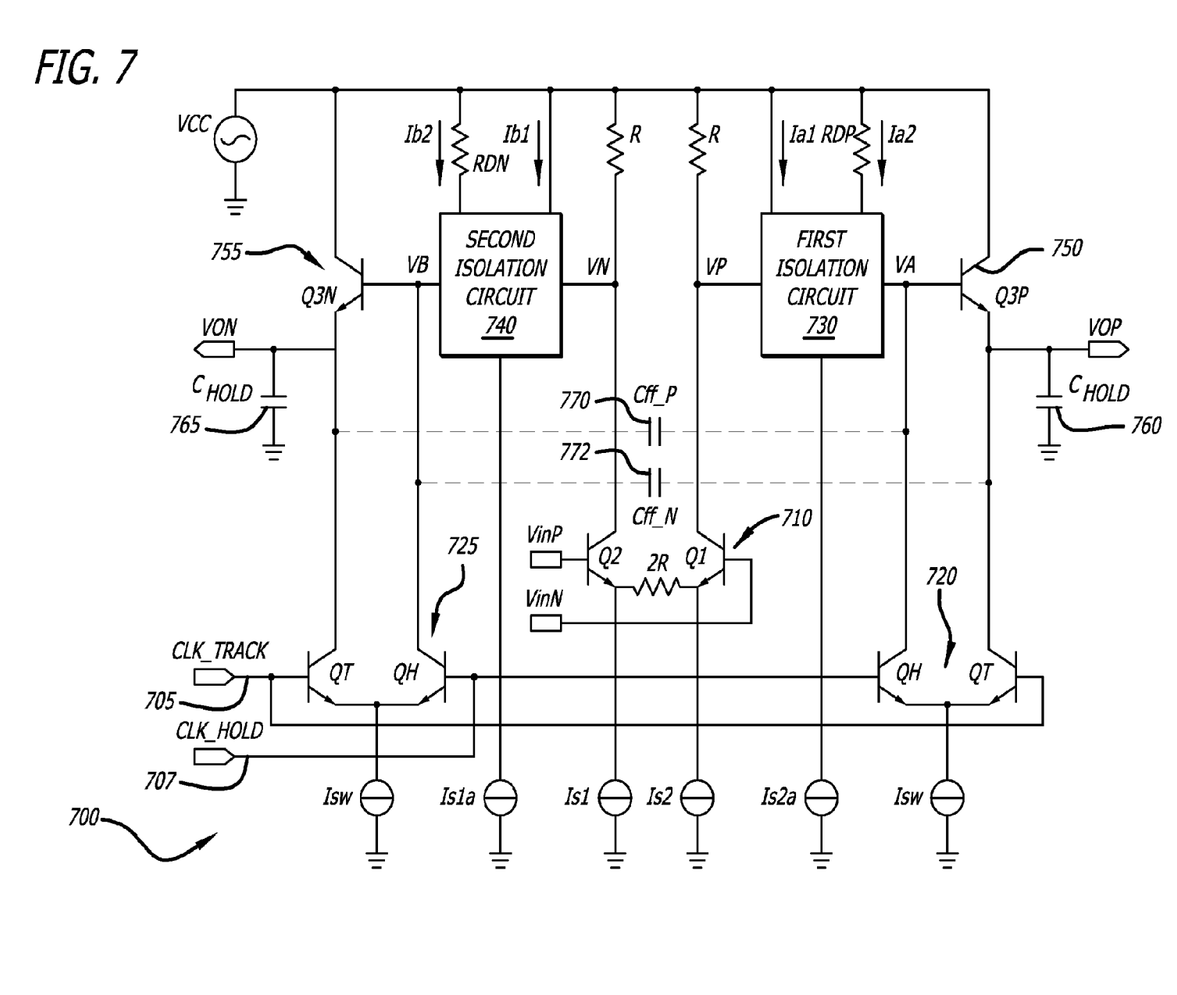
FIG. 7 illustrates an exemplary embodiment of a track-and-hold amplifier circuit implemented within the FIR filter of FIG. 6.

Referring now to FIG. 7, an exemplary embodiment of a track-and-hold (T/H) amplifier circuit 700, namely one of the T/H circuits $630_1$ implemented within FIR filter 600 of FIG. 6 is shown. According to this embodiment, T/H amplifier circuit 700 comprises a unity gain amplifier 710, a plurality of differential pairs 720 and 725, isolation circuits 730 and 740, and switched emitter-follower circuits 750 and 755.

Herein, T/H amplifier circuit 700 is adapted to operate in one of two operational modes: track mode and hold mode. In track mode, when CLK_Track signal 705 is active (e.g., logic "high"), transistors QT of differential pairs 720 and 725 are turned ON while transistors QH are turned OFF. Unity gain amplifier 710, being a transconductance amplifier featuring a differential pair (Q1, Q2), emitter degenerated resistor(s) 2R and a resistor load R, sets the voltage at nodes VP and VN. In particular, according to this embodiment of the invention, the voltage at node VP is equal to Vcc−Is1*R while the voltage at node VN is equal to Vcc−Is2*R, where these voltages are equal if the current Is1 is equal to Is2.

Transistors Q3P and Q3N act as emitter followers to track the input signal thereby charging hold capacitors 760 and 765. Transistors QT appear as cascade transistors as shown in FIG. 10B. Current Ia1, Ia2, Ib1 and Ib2 are optimized to be one-half of the tail current (Isw). An isolation circuit provides an excellent driving capability due to its output impedance is low. Therefore, no bandwidth reduction is compromised.

When given a "Hold" command is initiated by activating CLK_Hold signal 707 and deactivating CLK_Track signal 705, transistors QT of differential pairs 720 and 725 are turned OFF while transistors QH are turned ON. T/H circuit 700 holds the value of the input signal when the "Hold" command was issued, thereby serving as an analog storage device.

More specifically, when transistors QH are turned ON, the tail currents Isw flow through resistors RDP and RDN, transistors Q3P and Q3N are turned OFF and hold capacitor 760 and 765 stores the sampled voltage. Since the tail currents Isw are flowing through resistors RDP and RDN, the voltage at nodes VA and VB are pulled down to a value that drives transistors Q3P and Q3N in a reversed biased and causes isolation circuits 730 and 740 to isolate parasitic capacitance at the input from attenuating the output signal.

More specifically, upon review of the operations for one of the differential pairs, such as first differential pair 720, transistor QT is turned OFF and transistor QH is turned ON. Therefore, no current flows through transistor Q3P. Instead, all of the current (Isw) through transistor QH goes through resistor RDP, which pulls down the voltage measured at node VA by approximately 0.8 volts. This voltage drop causes first isolation circuit 730 to isolate its output (VoP) from its input (Vine) as measured at node VP.

Figure 8A:
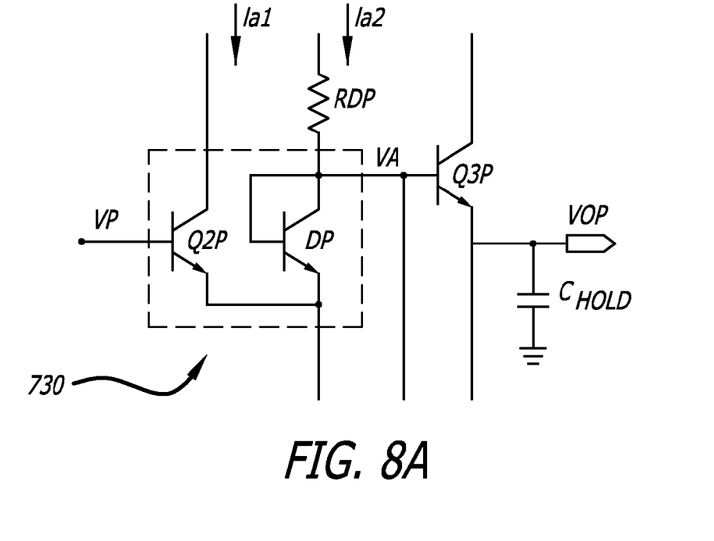
FIGS. 8A and 8B illustrate an exemplary embodiment of a first and second isolation circuits implemented within the track-and-hold amplifier circuit of FIG. 7.

Referring now to FIG. 8A, an exemplary embodiment of first isolation circuit 730 implemented within track-and-hold amplifier circuit 700 of FIG. 7 is shown. First isolation circuit 730 comprises an emitter follower buffer Q2P and a diode-connected transistor DP that are adapted to drive at least switched follower transistor Q3P 750 and perhaps one of the feedforward capacitors (Cff_P, Cff_N) 770 and 772 if implemented. Herein, when T/H circuit 700 is placed in Hold mode, the voltage measured at node VA is pulled by approximately 0.8 volts. This voltage drop further causes diode-connected transistor DP to become reverse biased, and as a result, the output voltage feedthrough ($V_{Afeedthrough}$) at node VA is reduced and can be represented as the following:

$$V_{Afeedthrough} = Vin*(RDP/Z_{DP}) \approx Vin*(1\ K\Omega/100\ K\Omega)$$

$$= 1/100*Vin, \text{ where}$$

$"Z_{DP}"$ is the impedance of transistor DP in reverse-bias mode.

Figure 8B:
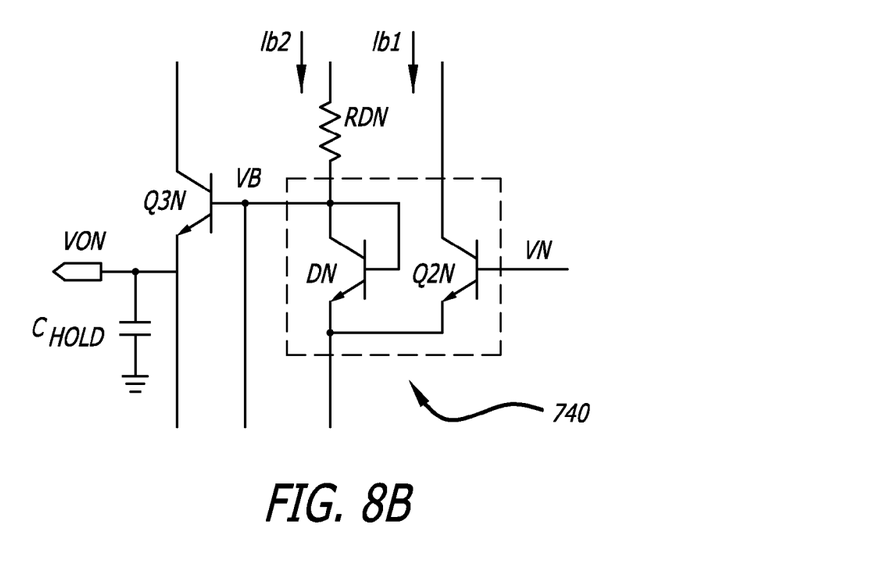

Similar in operation, all current (Isw) through transistor QH of second differential pair 725 goes through resistor RDN, which pulls down the voltage at node VB by approximately 0.8 volts. This voltage drop causes second isolation circuit 740 to isolate its output (VoN) from its input (VinN) as measured at node VN.

As shown in FIG. 8B, second isolation circuit 740 comprises an emitter follower buffer Q2N and a diode-connected transistor DN that are adapted to drive at least switched follower transistor Q3N and perhaps one of the feedforward capacitors (Cff_P, Cff_N) 770 and 772 if implemented. Herein, when T/H circuit 700 is placed in Hold mode, the voltage measured at node VB is pulled by approximately 0.8 volts. This voltage drop further causes diode-connected transistor DN to become reverse biased as described above.

$$V_{Bfeedthrough} = Vin*(RDN/Z_{DN}) \approx Vin*(1\ K\Omega/100\ K\Omega)$$

$$= 1/100*Vin, \text{ where:}$$

$"Z_{DN}"$ is the impedance of transistor DN in reverse-bias mode.

Optionally, feedforward capacitors (Cff_P, Cff_N) 770 and 772 can further reduce voltage feedthrough and are showed with feedforward capacitor Cff_P 770 coupled to an input of transistor Q3P and an output of transistor Q3N while feedforward capacitor Cff_N 772 is coupled to an input of transistor Q3N and an output of transistor Q3P.

$$V_{out(feedthrough)} = V_A \cdot \frac{Cje_{(Q3P)}}{C_{hold} + Cje_{(Q3P)}}\left(1 - \frac{Cff\_P}{Cje_{(Q3P)}}\right)$$

$Cje$ = base emitter junction capacitor at $Q3P$ $Chold$ = hold capacitor $Cff\_P$ = feedforward capacitor $VA$ = feedthrough voltage at node $A$.

Figure 9:
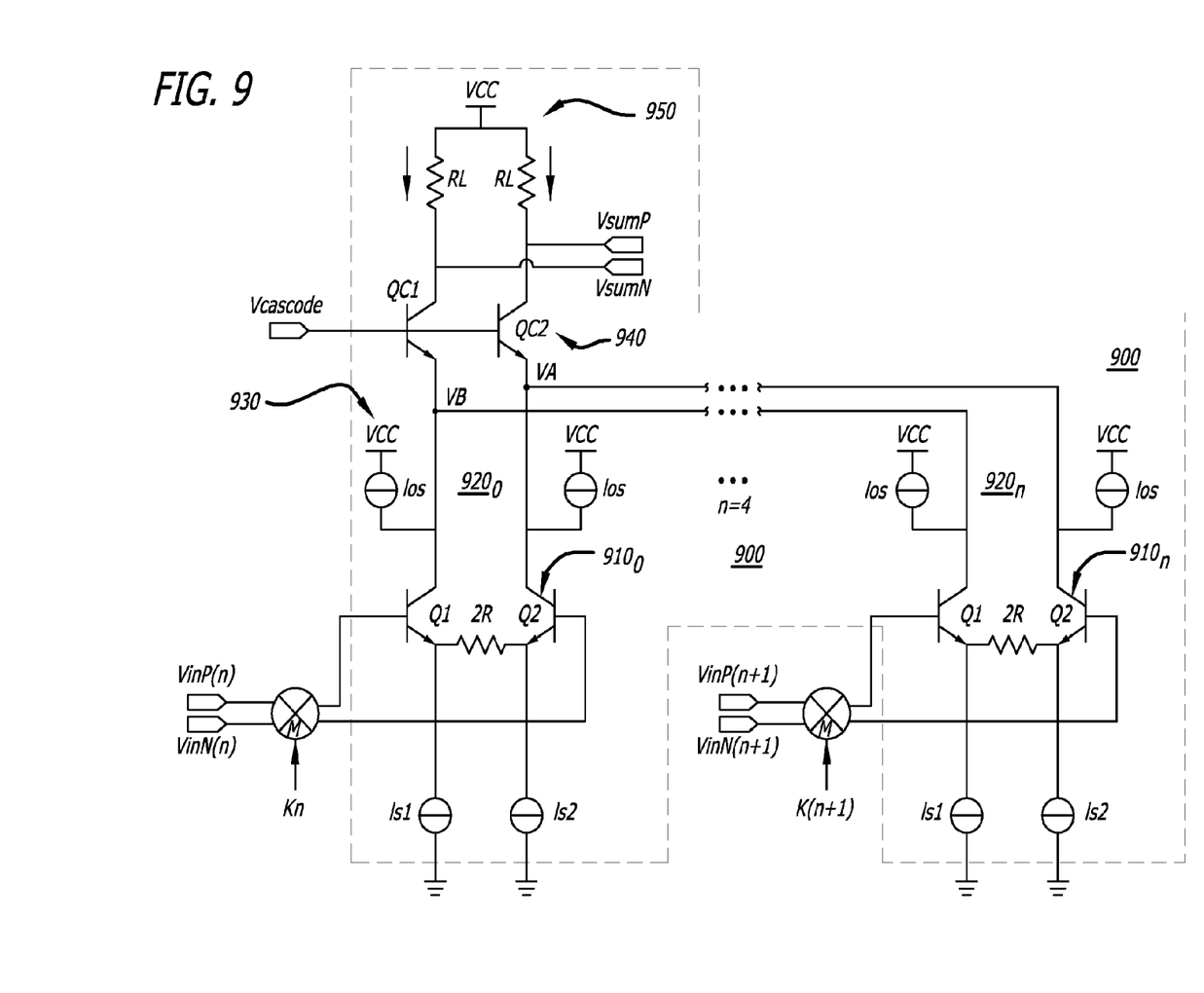
FIG. 9 illustrates an exemplary embodiment of a summing circuit implemented within the FIR filter of FIG. 6.

Referring now to FIG. 9, an exemplary embodiment of a summing junction circuit 900, namely one of the summing circuits 650 and 655 implemented within FIR filter 600 of FIG. 6 is shown. Herein, summing junction circuit 900 includes a plurality of parallel transconductance amplifiers 910$_0$-910$_n$ (where n=4) a plurality of current offset (Ios) circuits 920$_0$-920$_n$, cascode transistors (QC1, QC2) 940 and load resistors (RL) 950. For this embodiment of the invention, one or more of transconductance amplifiers 910$_0$-910$_n$ is configured to have a unity gain with a 300 Ohm degeneration register (2R=300Ω) is used to achieve good linearity and low power consumption Herein, focusing on the first stage 930 of junction circuit 900, Ios circuit 920$_0$ is applied to each collector of transistor Q1 and Q2 to reduce the quiescent current flow through load resistor (RL) which causes a large voltage drop across the load resistor. Cascode transistors QC1 and QC2 are incorporated in this design to prevent a severe bandwidth reduction caused by a large amount of parasitic capacitance namely Miller capacitance ($C_M$) and the unavoidable long routing parasitic capacitance.

Figure 10A:
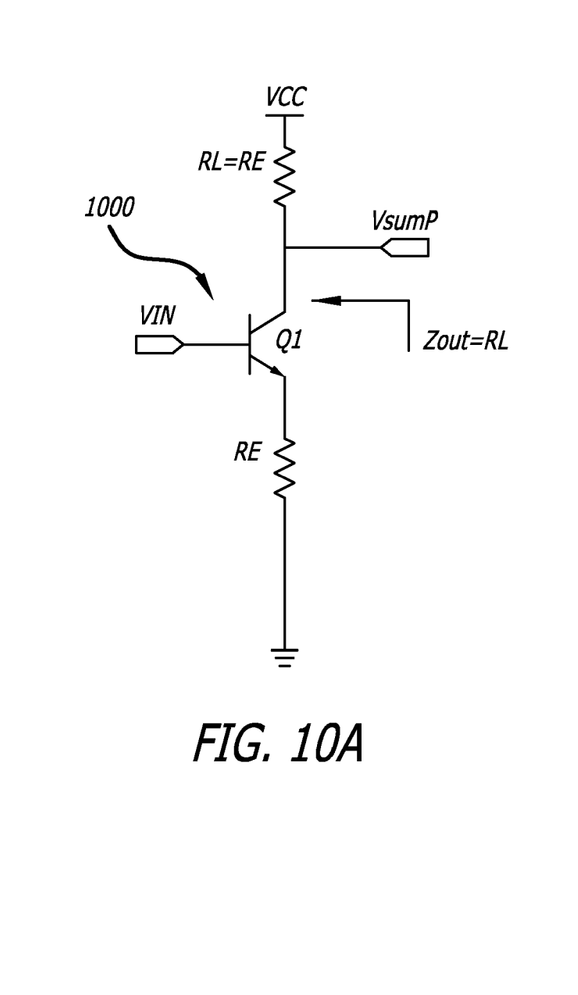
FIGS. 10A and 10B illustrate exemplary embodiments of cascade and non-cascode single stage amplifiers.
Figure 10B:
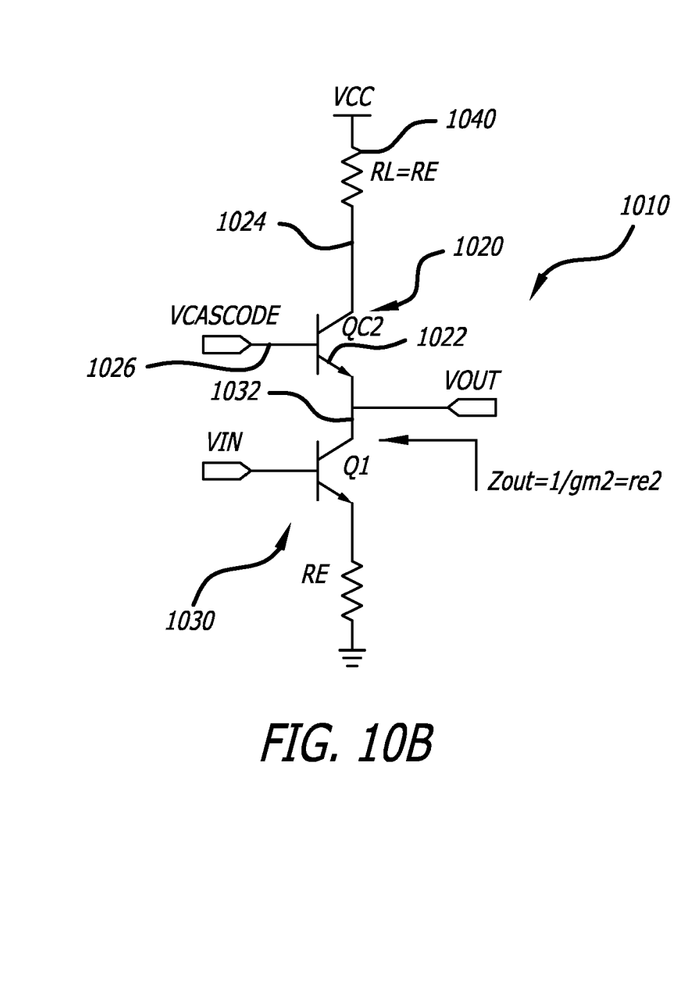

FIGS. 10A and 10B shows circuit diagrams of a single stage amplifier 1000 and 1010 without and with cascode. By adding transistor QC2 1020 to amplifier 1010 as shown in FIG. 10B with its emitter 1022 connected to the collector 1032 of transistor Q1 1030, its collector 1024 connected to the load resistor RL 1040 and its base 1026 connected through the input DC offset, the Miller effect of transistor Q1 1030 can be minimized. The gain equation for Vout/Vin (Av) in FIG. 10A is:

$$A_v = Vout/Vin = -gm*RL/(1+gm*RE) \text{ for } RL=RE$$

As the term gmRL gets much larger than one, Vout/Vin approaches −1. By substituting this gain into the Miller equation:

$$C_M = C_\mu(1-A_v) = 2C_\mu$$

The gain equation for Vout/Vin in FIG. 10B is:

$$A_v = Vout/Vin = -gm*re2/(1+gm*RE)$$

Since re2 is much smaller than RE, Vout/Vin>>−1. By substituting this gain into the miller equation:

$$C_M = C_\mu(1-A_v) \approx C_\mu$$

The Miller Capacitance (CM) now can be reduced by about a factor of two.

While the invention has been described in terms of several embodiments, the invention should not be limited to only those embodiments described, but can be practiced with modification and alteration within the spirit and scope of the appended claims.

What is claimed is:

1. A filter comprising:
a first bank clocked by a first sampling clock that receives an analog signal as input data and produces a first output signal, the first bank includes a first plurality of track and hold circuits, a first plurality of multipliers and a first summing circuit; and
a second bank clocked by a second sampling clock 180-degrees out of phase with the first sampling clock and receiving the analog signal as input data and produces a second output signal, the second bank includes a second plurality of track and hold circuits, a second plurality of multipliers and a second summing circuit,
wherein at least the first summing circuit comprises
a first load resistor coupled to a voltage source,
a second load resistor coupled to the voltage source,
a first cascode transistor including an emitter and a collector, the collector being coupled to the first load resistor,
a second cascode transistor including an emitter and a collector, the collector being coupled to the second load resistor,
a plurality of current offset circuits each coupled to the emitter of the first cascode transistor and the emitter of the second cascode transistor, and
a plurality of transconductance amplifiers in parallel and each corresponding to one of the plurality of current offset circuits.

2. The filter of claim 1, wherein at least one of the first plurality of track and hold circuits comprises.
a first differential output terminal,
a unity gain amplifier,
a first transistor including a base, a collector and an emitter, the emitter being coupled to the first differential output terminal,
a first differential pair that comprises a second transistor having a collector coupled to the emitter of the first transistor and a third transistor including a collector coupled to the base of the first transistor and an emitter coupled to the emitter of the second transistor, and
a first isolation circuit coupled to the unity gain amplifier, the collector of the third transistor of the first differential pair and the base of the first transistor, the first isolation circuit to isolate parasitic capacitance from attenuating an output signal at the first differential output terminal.

3. A summing circuit comprising:
a first cascode transistor including an emitter;
a second cascode transistor including an emitter;
a first current offset circuit coupled to the emitter of the first cascode transistor and the emitter of the second cascode transistor;
a first transconductance amplifier coupled to the first current offset circuit;
a first load resistor coupled to a collector of the first cascode transistor;
a second load resistor coupled to a collector of the second cascode transistor;
a second current offset circuit in parallel with the first current offset circuit and coupled to the emitter of the first cascode transistor and the emitter of the second cascode transistor; and
a second transconductance amplifier in parallel with the first transconductance amplifier and coupled to the second current offset circuit.

4. A summing circuit comprising:
a first cascode transistor including an emitter;
a second cascode transistor including an emitter;
a first current offset circuit coupled to the emitter of the first cascode transistor and the emitter of the second cascode transistor;
a first transconductance amplifier coupled to the first current offset circuit;
a second current offset circuit in parallel with the first current offset circuit and coupled to the emitter of the first cascode transistor and the emitter of the second cascode transistor; and
a second transconductance amplifier in parallel with the first transconductance amplifier and coupled to the second current offset circuit.

5. The summing circuit of claim 4 further comprising:
a third current offset circuit in parallel with the first current offset circuit and the second current offset circuit, the third current offset circuit being coupled to the emitter of the first cascode transistor and the emitter of the second cascode transistor; and
a third transconductance amplifier in parallel with the first transconductance amplifier and the second transconductance amplifier, the third transconductance amplifier being coupled to the second current offset circuit.

6. A summing circuit, implemented within a filter and coupled to a track-and-hold circuit operating as a delay prior to an output of the summing circuit being applied to an output signal of the filter, the summing circuit comprising:
a first transistor including an emitter;
a second transistor including an emitter;
a first current offset circuit coupled to the emitter of the first transistor and the emitter of the second transistor; and
a first transconductance amplifier coupled to the first current offset circuit.

7. The summing circuit of claim 6, wherein the first transistor is a cascode transistor.

8. The summing circuit of claim 7, wherein the second transistor is a cascode transistor.

9. The summing circuit of claim 6 further comprising:
a first load resistor coupled to a collector of the first transistor;
a second load resistor coupled to a collector of the second transistor;
a second current offset circuit in parallel with the first current offset circuit and coupled to the emitter of the first transistor and the emitter of the second transistor; and
a second transconductance amplifier in parallel with the first transconductance amplifier and coupled to the second current offset circuit.

10. The summing circuit of claim 6 further comprising:
a second current offset circuit in parallel with the first current offset circuit and coupled to the emitter of the first transistor and the emitter of the second transistor; and a second transconductance amplifier in parallel with the first transconductance amplifier and coupled to the second current offset circuit.

11. The summing circuit of claim 10 further comprising:

a third current offset circuit in parallel with the first current offset circuit and the second current offset circuit, the third current offset circuit being coupled to the emitter of the first transistor and the emitter of the second transistor; and a third transconductance amplifier in parallel with the first transconductance amplifier and the second transconductance amplifier, the third transconductance amplifier being coupled to the third current offset circuit.

* * * * *